United States Patent [19]
Yamano et al.

[11] Patent Number: 5,324,388
[45] Date of Patent: Jun. 28, 1994

[54] DRY ETCHING METHOD AND DRY ETCHING APPARATUS

[75] Inventors: Atsuhiro Yamano, Hyogo; Masafumi Kubota; Kenji Harafuji, both of Osaka, all of Japan

[73] Assignee: Matsushita Electric Industrial Co., Ltd., Kadoma, Japan

[21] Appl. No.: 74,613

[22] Filed: Jun. 11, 1993

[30] Foreign Application Priority Data

Jun. 22, 1992 [JP] Japan .................. 4-162470

[51] Int. Cl.$^5$ .................. H01L 21/306; B44C 1/22
[52] U.S. Cl. .................. 156/643; 156/345
[58] Field of Search .......... 156/626, 643, 646, 657, 156/662, 345; 204/192.32, 192.37, 298.37, 298.38; 118/723 MR, 723 MA

[56] References Cited

U.S. PATENT DOCUMENTS 5,111,111 5/1992 Stevens et al. .......... 204/298.38 X
5,245,157 9/1993 Ohiwa .......... 204/298.38 X

FOREIGN PATENT DOCUMENTS 63-250126 10/1988 Japan .

Primary Examiner—William Powell
Attorney, Agent, or Firm—Willian Brinks Hofer Gilson & Lione

[57] ABSTRACT

Magnetic coils are provided around a plasma generation chamber. To the plasma generation chamber is supplied a microwave which is generated by a microwave generator. Electron cyclotron resonance is caused by the interaction between a magnetic field produced by the magnetic coils and the microwave generated by the microwave generator, so as to accelerate electrons in the plasma generation chamber. The electrons thus accelerated generates a plasma. A reaction chamber is provided underneath the plasma generation chamber. The plasma generated in the plasma generation chamber is introduced to the reaction chamber to be used for etching a material on a sample stage. A reflex klystron is used as the microwave generator. By changing the cavity length of the reflex klystron, the resonance frequency of the cavity resonator is varied, thus modulating the frequency of the microwave supplied to the plasma generation chamber by the microwave generator.

10 Claims, 6 Drawing Sheets

DRY ETCHING METHOD AND DRY ETCHING APPARATUS

BACKGROUND OF THE INVENTION

The present invention relates to a dry etching method which utilizes a plasma produced by electron cyclotron resonance and to a dry etching apparatus which is used in the method.

The attainment of higher density in a semiconductor integrated circuit is closely related to the line width of its transistors, wires, and the like. By reducing the line width of these components, it becomes possible to produce a semiconductor integrated circuit with a micropattern having the line width of 1 μm or less. The realization of such a micropattern is largely attributed to the development of two types of techniques: photolithography and dry etching.

Plasma-assisted dry etching methods utilize the phenomenon that when a material to be etched is placed in a reactive plasma or a radical, each produced by applying a radio-frequency (RF) electric field to an appropriate gas, the material is subjected to etching. To form a micropattern, a photoresist pattern is typically used as a mask material.

As an embodiment of the dry etching methods mentioned above, an ECR dry etching apparatus which utilizes a plasma produced by electron cyclotron resonance (ECR) has recently been disclosed and manufactured on an industrial basis.

FIG. 6 is a view diagrammatically showing the ECR dry etching apparatus which utilizes electron cyclotron resonance generated by the interaction between a microwave and a magnetic field. In FIG. 6, 1 denotes a plasma generation chamber in which the pressure is regulated at an appropriate value (several mTorr). A reactive gas is supplied to the plasma generation chamber 1 through a supplying line 2 and exhausted therefrom through an exhaust line 3. To the plasma generation chamber 1 is connected a microwave generator 5 via a waveguide 4 with a rectangular section. The microwave energy generated by the microwave generator 5 is supplied to the reactive gas which has been introduced to the plasma generation chamber 1.

Around the plasma generation chamber 1 is provided magnetic coils 6, which generate a magnetic field in the plasma generation chamber. Electrons in the plasma generation chamber 1 are accelerated by electron cyclotron resonance which results from the interaction between the microwave generated by the microwave generator 5 and the magnetic field applied to the plasma generation chamber 1 by the magnetic coils 6. The accelerated electrons then produce a plasma.

Underneath the plasma generation chamber 1 is provided a reaction chamber 7 which is connected to the plasma generation chamber 1. The plasma generated in the plasma generation chamber 1 is introduced to the reaction chamber 7. In the lower part of the reaction chamber 7 is provided a sample stage 8 on which a semiconductor substrate 9 with a resist pattern is placed as a material to be etched.

The operation of the ECR dry etching apparatus of the above-mentioned structure will be described below.

When the microwave energy at the frequency of 2.45 GHz is supplied to the plasma generation chamber 1 by the microwave generator 5, the reactive gas in the plasma generation chamber 1 is ionized to produce electrons and ions. An magnetic field of 875 G is also supplied to the plasma generation chamber 1 by the magnetic coils 6 provided around the plasma generation chamber 1. The interaction between the microwave and the magnetic field causes electron cyclotron resonance in the plasma generation chamber 1, which allows the electrons therein to absorb the electromagnetic energy of the microwave and to be accelerated. The electrons thus accelerated exhibit a circular motion at high speeds in the plasma generation chamber 1.

The acceleration of the electrons is carried out most efficiently by electron cyclotron resonance when the strength of the magnetic field applied to the plasma generation chamber 1 by the magnetic coils 6 is 875 G and the frequency of the microwave is 2.45 GHz in the plasma generation chamber 1. The electrons in a high-speed circular motion collide with the reactive gas, which generates a plasma with a high density in the plasma generation chamber 1. By diffusion and by an electric field, the resulting plasma is transferred from the plasma generation chamber 1 to the reaction chamber 7 along the magnetic lines formed by the magnetic coils 6, so as to be used in the thin-film formation or the etching treatment on the surface of the semiconductor substrate 9 placed in the reaction chamber 7.

In the above-mentioned ECR dry etching apparatus utilizing electron cyclotron resonance, the plasma is produced by causing electron cyclotron resonance in the plasma generation chamber through the interaction between the microwave energy and the magnetic field, causing a high-speed circular motion of the electrons due to the electron cyclotron resonance in the plasma generation chamber, and then causing collisions of the electrons in a high-speed circular motion with the reactive gas.

The microwave energy is supplied to the electrons most efficiently when the frequency f of the microwave and the strength B of the applied magnetic field fulfill the following condition of electronic cyclotron resonance (hereinafter referred to as the ECR condition):

$$f = q \times B / 2\pi m \tag{1}$$

wherein $q$ ($=1.602 \times 10^{-19}$ C) denotes the unit charge and m ($=9.110 \times 10^{-31}$ kg) denotes the mass of the electrons. The optimum value of the microwave frequency f is 2.45 GHz when the strength B of the magnetic field produced by the magnetic coils is 875 G.

However, it is practically difficult to obtain a uniform strength of magnetic field which is applied by the magnetic coils to the plasma generation chamber. The strength of the magnetic field is relatively strong in the central portion of the plasma generation chamber while it is relatively weak in the marginal portion thereof. Consequently, the plasma density is relatively high in the central portion of the plasma generation chamber because the electrons in the central portion absorb the microwave energy efficiently, while it is relatively low in the marginal portion of the plasma generation chamber because the electrons in the marginal portion cannot absorb the microwave energy efficiently.

As described above, the distribution of the plasma density in the plasma generation chamber is not uniform in the conventional ECR dry etching apparatus, so that the amount of reactive ions which reach the surface of the semiconductor substrate placed in the reaction chamber is not uniform, either, which makes it difficult to treat the surface of the semiconductor substrate uniformly.

To overcome the difficulty, Japanese Laid-open Patent Publication No. 63-251026 discloses a plasma treatment apparatus in which the waveform of an electric current supplied to the magnetic coils is varied with the passage of time to form a rotary magnetic field which rotates the plasma current in the plasma generation chamber, thereby intending to realize a uniform plasma density.

However, it is extremely difficult in the abovementioned plasma treatment apparatus to control the distribution of the magnetic field so that the whole plasma can efficiently absorb the electromagnetic energy of the microwave, because the magnetic field is formed in the plasma in the plasma generation chamber. Hence, the realization of the uniform plasma density in the abovementioned plasma treatment apparatus has its own limitations.

Moreover, though the plasma density is relatively high in the central portion of the plasma generation chamber because of the stronger magnetic field there, it is relatively low in the marginal portion of the plasma generation chamber because of the weaker magnetic field there, so that the overall plasma density throughout the plasma generation chamber is not increased.

SUMMARY OF THE INVENTION

It is an object of the present invention to provide a method of and an apparatus for generating a plasma whereby a uniform plasma with an increased density can surely be obtained.

To achieve the above-mentioned object, the present invention provides increased points which fulfill the ECR condition and which shift their positions with the passage of time, so that a uniform plasma with a higher density can be obtained.

Concretely, a dry etching method according to the present invention comprises: a first step of applying a magnetic field to a plasma generation chamber to which a reactive gas is introduced; a second step of generating a microwave at such a frequency as to cause electron cyclotron resonance in said plasma generation chamber through the interaction with the magnetic field applied to said plasma generation chamber while modulating the frequency of the microwave within a specified band; a third step of supplying the resultant microwave to said plasma generation chamber so as to cause said electron cyclotron resonance, which then generates a plasma in said plasma generation chamber; and a forth step of etching a material by using the resultant plasma.

The magnetic field applied to the inside of the plasma generation chamber by the means for applying a magnetic field is not uniform. On a plane parallel to the magnetic field in the plasma generation chamber, the field strength becomes maximum in a portion on the side for introducing the microwave while it becomes minimum on the side of the reaction chamber. When the microwave at a modified frequency is supplied to the plasma generation chamber, there exist a plurality of points which fulfill the ECR condition and which shift their positions on the plane perpendicular to the magnetic field with the passage of time. It follows that an increased number of points which fulfill the ECR condition exist everywhere in the plasma generation chamber.

Consequently, the surface of a semiconductor substrate can be etched efficiently and uniformly because a uniform plasma with a high density is generated in the plasma generation chamber.

It is preferred that the second step of said dry etching method is for generating the microwave at such a frequency $f_0$ as to fulfill the condition of electron cyclotron resonance with respect to the magnetic field strength $B_0$ when the maximum and minimum strengths of the magnetic field applied to said plasma generation chamber are $B_{max}$ and $B_{min}$ ($B_{min} < B_0 < B_{max}$), while modulating the frequency $f_0$ of the microwave within a band which is obtained by increasing and decreasing $f_0$ by an amplitude given by $\max(((B_{max}-B_0)/B_0) \times f_0, ((B_0-B_{min})/B_0) \times f_0)$.

Thus, the ECR condition is fulfilled in time throughout the plasma generation chamber and hence the electromagnetic energy of the microwave is efficiently absorbed by the electrons in every region of the plasma generation chamber 1, resulting in the generation of a uniform plasma with a higher density.

It is preferred that the second step of said dry etching method is for generating the microwave at such a frequency $f_1$ as to fulfill the condition of electron cyclotron resonance with respect to the magnetic field strength $B_1$ when the maximum and minimum strengths of the magnetic field applied to said plasma generation chamber are $B_{max}$ and $B_{min}$ ($B_1 = (B_{max}+B_{min})/2$), while modulating the frequency $f_1$ of the microwave within a band which is obtained by increasing and decreasing $f_1$ by an amplitude given by $((B_{max}-B_{min})/(B_{max}+B_{min})) \times f_1$.

Thus, the ECR condition is fulfilled in time throughout the plasma generation chamber 1 and hence the electromagnetic energy of the microwave is efficiently absorbed by the electrons in the whole plasma generation chamber 1, resulting in the generation of a uniform plasma with a higher density.

It is preferred that in the second step of said dry etching method, the frequency for modulating the frequency of said microwave is 10 Hz or more.

Since the time required for a process of dry etching is typically several hundreds of seconds, the frequency of the microwave is modulated 1000 times or more during the process, which surely generates a uniform plasma with a higher density in the plasma generation chamber.

The dry etching apparatus according to the present invention comprises: a plasma generation chamber to which a reactive gas is introduced; a means for applying a magnetic field to said plasma generation chamber; a means for generating a microwave which generates the microwave at such a frequency as to cause electron cyclotron resonance in said plasma generation chamber through the interaction with the magnetic field applied to said plasma generation chamber while modulating the frequency of the microwave within a specified band and which supplies the resultant microwave to said plasma generation chamber so as to generate a plasma in said plasma generation chamber; and a reaction chamber which is connected to said plasma generation chamber for introducing thereto the plasma generated in said plasma generation chamber and for etching a material by using the plasma introduced.

Thus, the frequency of the microwave supplied to the plasma generation chamber can be modulated within a specified band, because the dry etching apparatus comprises the means for modulating within a specified band the frequency of the microwave which is supplied to the plasma generation chamber by the means for generating a microwave.

It is preferred that the means for generating a microwave of said dry etching apparatus generates the microwave at such a frequency $f_0$ as to fulfill the condition of electron cyclotron resonance with respect to the magnetic field strength $B_0$ when the maximum and minimum strengths of the magnetic field applied to said plasma generation chamber are $B_{max}$ and $B_{min}$ ($B_{min} < B_0 < B_{max}$), while modulating the frequency $f_0$ of the microwave within the band which is obtained by increasing and decreasing $f_0$ by an amplitude given by $\max(((B_{max}-B_0)/B_0) \times f_0, ((B_0-B_{min})/B_0) \times f_0)$.

Thus, the ECR condition is fulfilled throughout the plasma generation chamber with the passage of time.

It is preferred that the means for generating a microwave of said dry etching apparatus generates the microwave at such a frequency $f_1$ as to fulfill the condition of electron cyclotron resonance with respect to the magnetic field strength $B_1$ when the maximum and minimum strengths of the magnetic field applied to said plasma generation chamber are $B_{max}$ and $B_{min}$ ($B_1 = (B_{max} + B_{min})/2$), while modulating the frequency $f_1$ of the microwave within the band which is obtained by increasing and decreasing $f_1$ by an amplitude given by $((B_{max}-B_{min})/(B_{max}+B_{min})) \times f_1$.

Thus, the ECR condition is efficiently fulfilled throughout the plasma generation chamber with the passage of time.

It is preferred that the frequency with which the means for generating a microwave of said dry etching apparatus modulates the frequency of the microwave is set at 10 Hz or more. Thus, the frequency of the microwave is modulated 1000 times or more during a process.

It is preferred that the means for generating a microwave of said dry etching apparatus is a klystron or traveling-wave tube. Thus, the means for generating a microwave which can modulate the frequency can surely be obtained.

DETAILED DESCRIPTION OF THE PREFERRED EMBODIMENT

An embodiment of the present invention will be described below with reference to the drawings.

Figure 1:
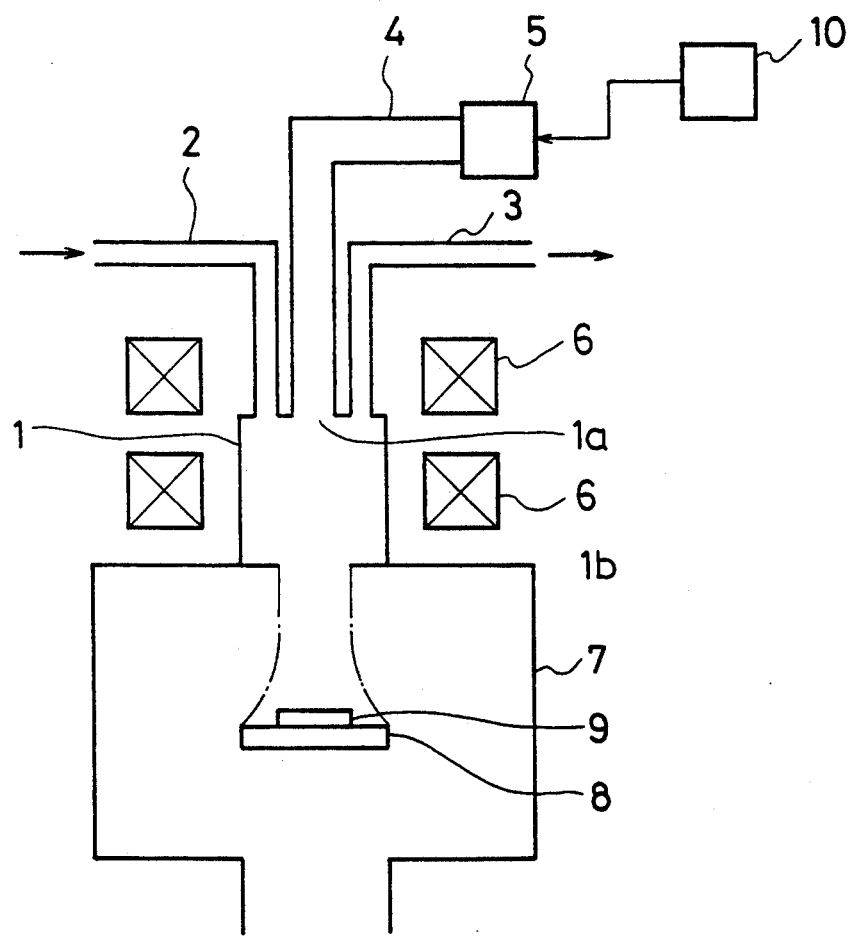
FIG. 1 is a view diagrammatically showing an ECR dry etching apparatus according to an embodiment of the present invention.

FIG. 1 is a view diagrammatically showing an ECR dry etching apparatus according to an embodiment of the present invention. In FIG. 1, 1 denotes a plasma generation chamber in which the pressure is regulated at an appropriate value (several hundred mTorr). A reactive gas is supplied to the plasma generation chamber 1 through a supplying line 2 and exhausted therefrom through an exhaust line 3. To the plasma generation chamber 1 is connected a microwave generator 5 as a means for generating a microwave via a waveguide 4 with a rectangular section. The microwave energy generated by the microwave generator 5 is supplied to the reactive gas which has been introduced to the plasma generation chamber 1. In the present embodiment, the microwave generator 5 is composed of a reflex klystron.

Around the plasma generation chamber 1 is provided magnetic coils 6 as a means for applying a magnetic field to the plasma generation chamber 1. The electrons in the plasma generation chamber 1 are accelerated by electron cyclotron resonance which is caused by the interaction between the microwaves generated by the microwave generator 5 and the magnetic field applied to the plasma generation chamber 1 by the magnetic coils 6. The accelerated electrons then produce a plasma.

Underneath the plasma generation chamber 1 is provided a reaction chamber 7 which is connected to the plasma generation chamber 1. The plasma generated in the plasma generation chamber 1 is introduced to the reaction chamber 7. In the lower part of the reaction chamber 7 is provided a sample stage 8 on which a semiconductor substrate 9 with a resist pattern is placed as a material to be etched.

As shown in FIG. 1, a frequency modulator 10 as a means for modulating a frequency is connected to the microwave generator 5. The method of modulating the oscillation frequency with the use of the reflex klystron is subdivided into the mechanical tuning method and the electronic tuning method. The mechanical tuning method varies the resonance frequency of the cavity resonator by changing the cavity length and the electronic tuning method varies the travel time of the electrons by changing the voltage of the repelling electrode. The present embodiment adopted the mechanical tuning method to vary the oscillation frequency. That is, the oscillation frequency was varied mechanically by changing the length of the cavity of the reflex klystron periodically.

Instead of the reflex klystron, the microwave generator 5 can also be composed of a traveling-wave tube which can modulate the oscillation frequency. When the traveling-wave tube is used, the frequency can be modulated by changing the electric current which flows through the electric solenoid.

Figure 2A:
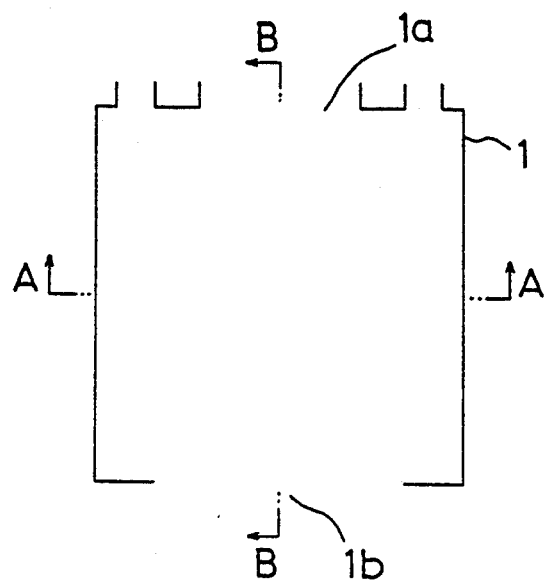
FIGS. 2A, 2B and 2C are views showing the relationship between the modulation of the frequency of a microwave from the microwave generator and the horizontal and vertical distribution of the magnetic field in the plasma generation chamber.
Figure 2C:
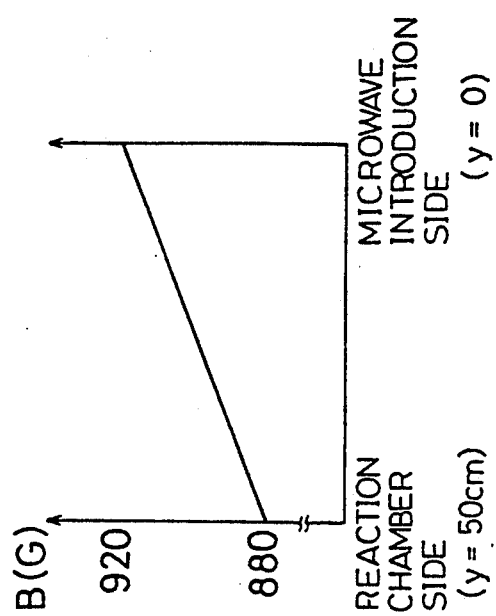
Figure 2B:
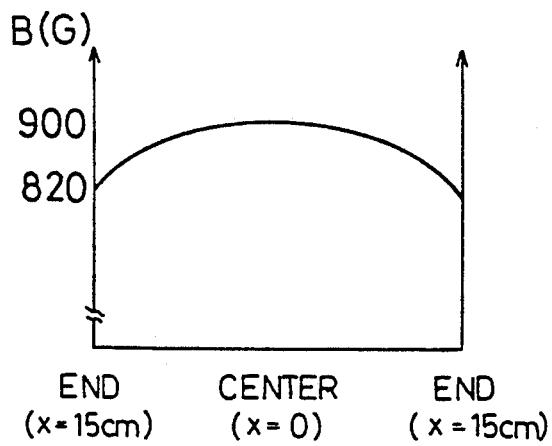

FIG. 2 shows the relationship between the modulation of the frequency of a microwave from the microwave generator 5 and the distribution of the magnetic field in the plasma generation chamber 1 which were measured in this experiment.

In the plasma generation chamber 1 (30 cm in diameter, 50 cm in height), the strength of the magnetic field produced by the magnetic coils 6 is not uniform (e.g., 875 G). In general, the magnetic field in the plasma generation chamber 1 was stronger in its central portion ($x=0$ cm) and weaker in its marginal portion ($x=\pm15$ cm) on a plane perpendicular to the magnetic field (the plane of the line A—A in FIG. 2). On the other hand, the magnetic field in the plasma generation chamber 1 was stronger in the portion 1a (y=0) on the side for introducing the microwave and smaller in the portion 1b (y=50 cm) on the side of the reaction chamber on a plane parallel to the magnetic field (the plane of the B—B line in FIG. 2). The maximum strength $B_{max}$ and minimum strength $B_{min}$ of the magnetic field in the plasma generation chamber 1 were 920 G and 800 G, respectively. In order for the plasma to absorb the electromagnetic energy of the microwave efficiently, the preferred frequency $f_0$ of the microwave is 2.45 GHz because it fulfills the ECR condition with respect to the magnetic field strength B of 875 G, which is the strength commonly used in the ECR dry etching apparatus.

Figure 3A:
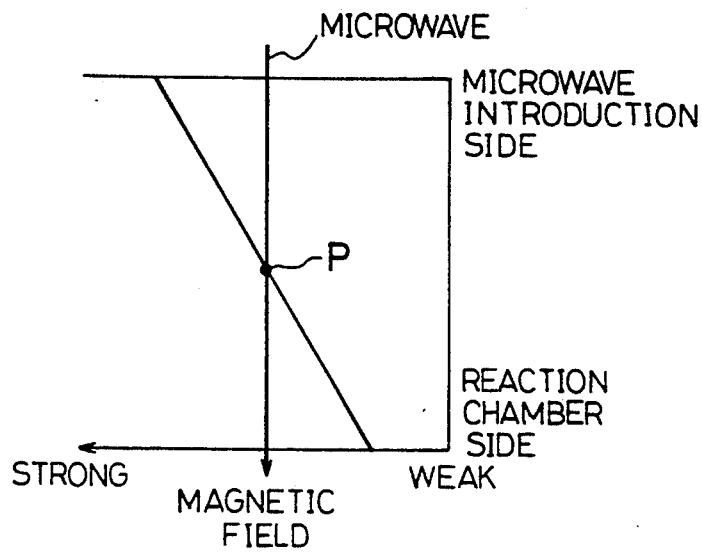
FIG. 3(a) is a view showing the distribution of ECR points when the microwave at a constant frequency is introduced.
Figure 3B:
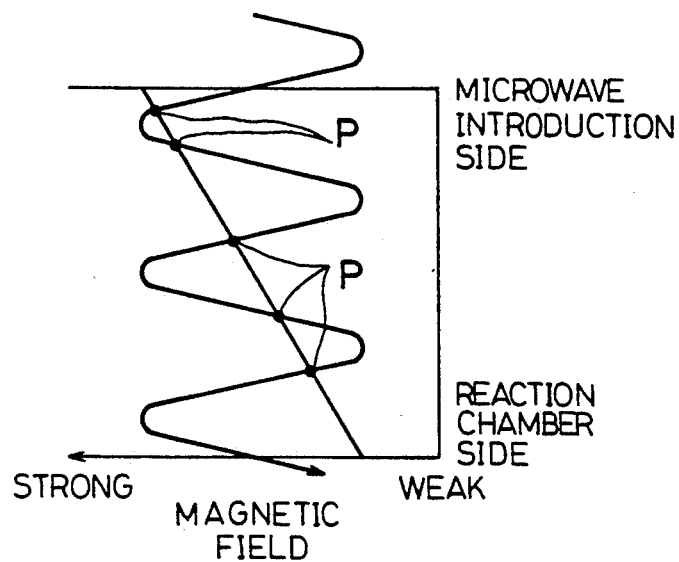
FIG. 3(b) is a view showing the distribution of the ECR points when the microwave at a modulated frequency is introduced.

When the microwave at a constant frequency is introduced as shown in FIG. 3(a), there exists only one point P that fulfills the ECR condition (ECR point) on a plane parallel to the magnetic field. On the contrary, when the microwave at a modulated frequency is introduced as shown in FIG. 3(b), a plurality of ECR points P exist on the plane parallel to the magnetic field. Moreover, each ECR point shifts its position in the plasma generation chamber 1 with the passage of time. It follows that the ECR points P are observed everywhere in the plasma generation chamber 1, so that a uniform plasma with a high density can be generated in the plasma generation chamber 1.

Below, the relationships among the strength of the magnetic field applied to the plasma generation chamber 1 by the magnetic coils 6, the frequency of the microwave supplied to the plasma generation chamber 1 by the microwave generator 5, and the modulation band of said microwave will be described.

When $B_{max}$ and $B_{min}$ denote the maximum and minimum strengths of the magnetic field applied to the plasma generation chamber 1 by the magnetic coils 6, respectively, it is preferred to supply to the plasma generation chamber 1 the microwave at the frequency $f_0$ (e.g., 2.45 GHz) which fulfills the condition of electron cyclotron resonance with respect to the magnetic field strength $B_0$ (e.g., 875 G) which fulfills the condition $B_{min} < B_0 < B_{max}$.

It is preferred that the frequency $f_0$ of the microwave modulates within the band of 2.66 GHz–2.24 GHz centering around 2.45 GHz. The band is obtained by increasing and decreasing the frequency $f_0$ of 2.45 GHz by 0.21 GHz, which is the amplitude given by $\max(((B_{max}-B_0)/B_0) \times f_0, ((B_0-B_{min})/B_0) \times f_0)$. Thus, the ECR condition is fulfilled in time throughout the plasma generation chamber 1 and the electromagnetic energy of the microwave is efficiently absorbed by the electrons in the whole plasma generation chamber 1, resulting in the generation of a uniform plasma with a high density.

When $B_{max}$ and $B_{min}$ denote the maximum and minimum strengths of the magnetic field applied to the plasma generation chamber 1 by the magnetic coils 6, respectively, it is particularly preferred to supply to the plasma generation chamber 1 the microwave at the frequency $f_1$ (2.41 GHz) which fulfills the condition of electron cyclotron resonance with respect to the magnetic field strength $B_1$ (860 G) which fulfills the condition $B_1 = (B_{max}+B_{min})/2$ and to modulate the frequency $f_1$ of the microwave within the band of 2.58 GHz–2.24 GHz centering around 2.41 GHz. The band is obtained by increasing and decreasing the frequency $f_1$ of 2.41 GHz by 0.17 GHz, which is the amplitude given by $((B_{max}-B_{min})/(B_{max}+B_{min})) \times f_1$. In this way, the unused region of the microwave is removed so that a uniform plasma with a higher density can be produced.

The frequency for modulating the microwave equals the frequency at which the cavity length is mechanically changed, and is preferably 10 Hz or more for the following reason: the frequency for modulating the microwave is required to be sufficiently high in terms of the process adopted. In case of dry etching, the time required for a process is typically several hundreds of seconds and modulation is preferably performed about 1000 times or more, so that an appropriate frequency for modulating the microwave is 10 Hz or more.

Figure 4:
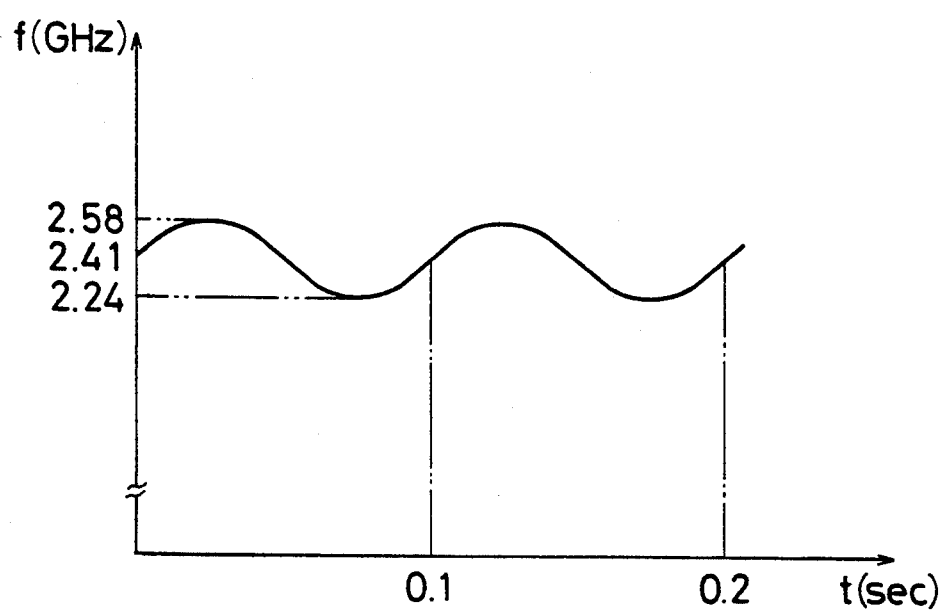
FIG. 4 is a view showing the frequency variation in time of the microwave at a modulated frequency.

FIG. 4 shows the frequency variation in time when the frequency $f_1$ (2.41 GHz) of the microwave is modulated with the frequency of 10 Hz within the band of 2.58 GHz–2.24 GHz.

Figure 5A:
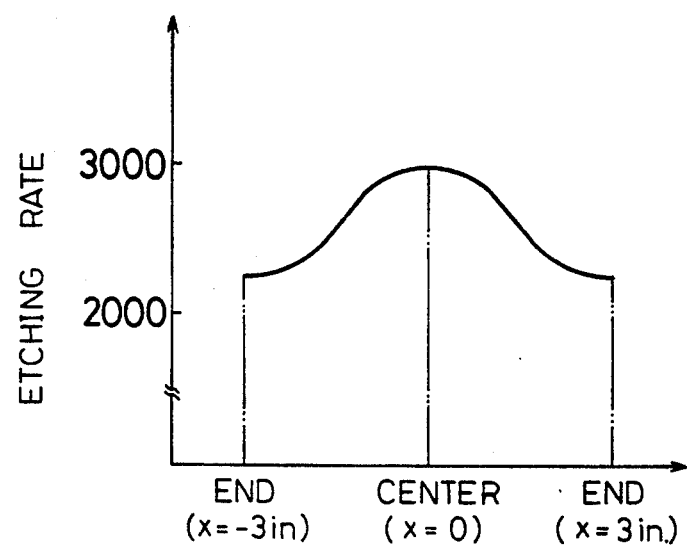
FIG. 5(a) is a view showing the distribution of etching rates on the surface of a wafer when the frequency of the microwave is not modulated.
Figure 5B:
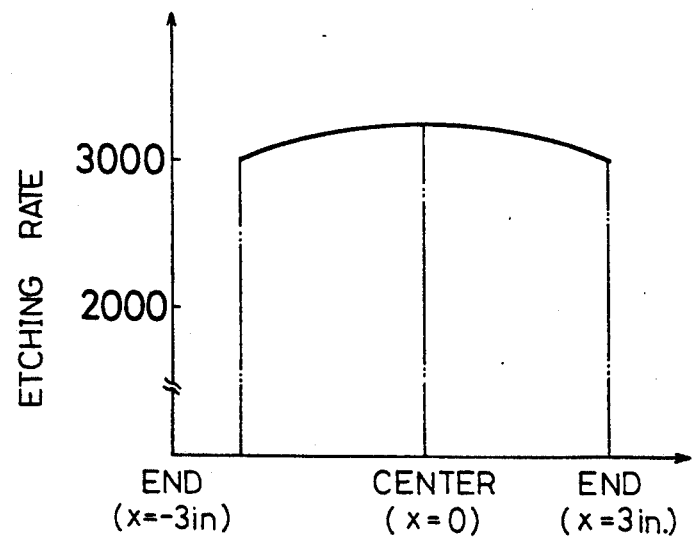
FIG. 5(b) is a view showing the distribution of etching rates on the surface of the wafer when the frequency of the microwave is modulated.
Figure 6:
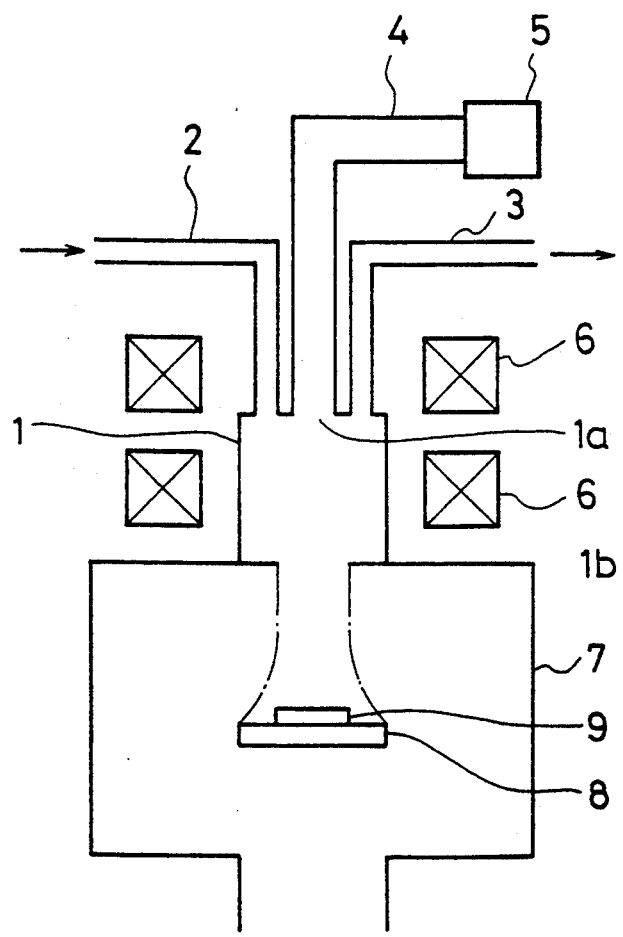
FIG. 6 is a view diagrammatically showing the ECR dry etching apparatus.

Etching rates in polysilicon were measured on the surface of a wafer (6 in.) by modulating and not modulating the frequency of the microwave, the results of which are shown in FIG. 5. Here, $HBr + Cl_2$ was used as an etching gas. FIG. 5(a) shows the distribution of etching rates on the wafer when the frequency of the microwave was not modulated. In this case, a relatively high etching rate was locally obtained while etching rates differ greatly throughout the wafer. FIG. 5(b) shows the distribution of etching rates on the wafer when the frequency of the microwave was modulated. In this case, a roughly uniform etching rate was obtained throughout the wafer and the average etching rate was increased for the following reason: In the case where the frequency of the microwave is not modulated, the ECR condition is fulfilled only in the limited region of the plasma generation chamber 1, while the ECR condition is fulfilled everywhere in the plasma generation chamber 1 in the case where the frequency of the microwave is modulated, so that the electromagnetic energy of the microwave is absorbed by the electrons efficiently and uniformly.

I claim:

1. A dry etching method comprising:
   a first step of applying a magnetic field to a plasma generation chamber to which a reactive gas is introduced;
   a second step of generating a microwave at such a frequency as to cause electron cyclotron resonance in said plasma generation chamber through the interaction with the magnetic field applied to said plasma generation chamber while modulating the frequency of the microwave within a specified band;
   a third step of supplying the resultant microwave to said plasma generation chamber so as to cause said electron cyclotron resonance, which then generates a plasma in said plasma generation chamber; and
   a forth step of etching a material by using the resultant plasma.

2. A dry etching method according to claim 1, wherein said second step is for generating the microwave at such a frequency $f_0$ as to fulfill the condition of electron cyclotron resonance with respect to the magnetic field strength $B_0$ when the maximum and minimum strengths of the magnetic field applied to said plasma generation chamber are $B_{max}$ and $B_{min}$ ($B_{min} < B_0 < B_{max}$), while modulating the frequency $f_0$ of the microwave within a band which is obtained by increasing and decreasing $f_0$ by an amplitude given by $\max(((-B_{max}-B_0)/B_0)\times f_0, ((B_0-B_{min})/B_0)\times f_0)$.

3. A dry etching method according to claim 1, wherein said second step is for generating the microwave at such a frequency $f_1$ as to fulfill the condition of electron cyclotron resonance with respect to the magnetic field strength $B_1$ when the maximum and minimum strengths of the magnetic field applied to said plasma generation chamber are $B_{max}$ and $B_{min}$ ($B_1=(B_{max}+B_{min})/2$), while modulating the frequency $f_1$ of the microwave within a band which is obtained by increasing and decreasing $f_1$ by an amplitude given by $((B_{max}-B_{min})/(B_{max}+B_{min}))\times f_1$.

4. A dry etching method according to claim 1, wherein the frequency for modulating the frequency of said microwave in said second step is 10 Hz or more.

5. A dry etching apparatus comprising:
a plasma generation chamber to which a reactive gas is introduced;
a means for applying a magnetic field to said plasma generation chamber;
a means for generating a microwave which generates the microwave at such a frequency as to cause electron cyclotron resonance in said plasma generation chamber through the interaction with the magnetic field applied to said plasma generation chamber while modulating the frequency of the microwave within a specified band and which supplies the resultant microwave to said plasma generation chamber so as to generate a plasma in said plasma generation chamber; and
a reaction chamber which is connected to said plasma generation chamber for introducing thereto the plasma generated in said plasma generation chamber and for etching a material by using the plasma introduced.

6. A dry etching apparatus according to claim 5, wherein said means for generating a microwave generates the microwave at such a frequency $f_0$ as to fulfill the condition of electron cyclotron resonance with respect to the magnetic field strength $B_0$ when the maximum and minimum strengths of the magnetic field applied to said plasma generation chamber are $B_{max}$ and $B_{min}$ ($B_{min}<B_0<B_{max}$), while modulating the frequency $f_0$ of the microwave within a band which is obtained by increasing and decreasing $f_0$ by an amplitude given by $\max(((-B_{max}-B_0)/B_0)\times f_0, ((B_0-B_{min})/B_0)\times f_0)$.

7. A dry etching apparatus according to claim 5, wherein said means for generating a microwave generates the microwave at such a frequency $f_1$ as to fulfill the condition of electron cyclotron resonance with respect to the magnetic field strength $B_1$ when the maximum and minimum strengths of the magnetic field applied to said plasma generation chamber are $B_{max}$ and $B_{min}$ ($B_1=(B_{max}+B_{min})/2$), while modulating the frequency $f_1$ of the microwave within a band which is obtained by increasing and decreasing $f_1$ by an amplitude given by $((B_{max}-B_{min})/(B_{max}+B_{min}))\times f_1$.

8. A dry etching apparatus according to claim 5, wherein the frequency with which said means for generating a microwave modulates the frequency of the microwave is 10 Hz or more.

9. A dry etching apparatus according to claim 5, wherein said means for generating a microwave is a klystron.

10. A dry etching apparatus according to claim 5, wherein said means for generating a microwave is a traveling-wave tube.

* * * * *